(12) United States Patent
Mochizuki et al.

(10) Patent No.: US 7,282,719 B2
(45) Date of Patent: Oct. 16, 2007

(54) IMAGE PICKUP APPARATUS AND RADIATION IMAGE PICKUP APPARATUS

(75) Inventors: Chiori Mochizuki, Sagamihara (JP); Masakazu Morishita, Hiratsuka (JP); Keiichi Momura, Honjo (JP); Minoru Watanabe, Honjo (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 154 days.

(21) Appl. No.: 11/227,149

(22) Filed: Sep. 16, 2005

(65) Prior Publication Data

US 2006/0077308 A1 Apr. 13, 2006

(30) Foreign Application Priority Data

Sep. 30, 2004 (JP) ............................. 2004-286994

(51) Int. Cl.
*G01T 1/24* (2006.01)
*H04N 5/70* (2006.01)

(52) U.S. Cl. .................................. 250/370.14; 348/800

(58) Field of Classification Search ........... 250/370.09, 250/370.11, 370.14, 336.1; 348/800
See application file for complete search history.

(56) References Cited

U.S. PATENT DOCUMENTS

| | | | |
|---|---|---|---|
| 4,857,751 A | 8/1989 | Hatanaka et al. ............ 250/578 |
| 5,073,828 A | 12/1991 | Yamada et al. .............. 358/482 |
| 5,245,203 A | 9/1993 | Morishita et al. ............ 257/113 |
| 5,283,428 A | 2/1994 | Morishita et al. ......... 250/214.1 |
| 5,352,920 A | 10/1994 | Morishita et al. ............ 257/435 |
| 5,412,243 A | 5/1995 | Morishita ..................... 257/462 |
| 5,567,956 A | 10/1996 | Yamanobe et al. ............ 257/55 |
| 5,583,361 A | 12/1996 | Morishita .................... 257/345 |
| 5,680,229 A | 10/1997 | Yamanobe et al. .......... 358/482 |
| 5,965,872 A * | 10/1999 | Endo et al. ............... 250/208.1 |
| 6,069,393 A | 5/2000 | Hatanaka et al. ............ 257/434 |
| 6,239,439 B1 * | 5/2001 | Itabashi et al. ......... 250/370.11 |
| 6,295,142 B1 | 9/2001 | Watanabe et al. ............ 358/482 |
| 6,512,543 B1 * | 1/2003 | Kuroda et al. .............. 348/302 |
| 6,623,990 B2 | 9/2003 | Watanabe et al. ............... 438/4 |
| 6,753,915 B1 * | 6/2004 | Mochizuki ................... 348/302 |
| 7,030,385 B2 * | 4/2006 | Mochizuki ............. 250/370.11 |
| 7,034,309 B2 | 4/2006 | Mochizuki ............. 250/370.09 |
| 7,126,127 B2 | 10/2006 | Watanabe et al. ....... 250/370.01 |
| 2006/0138334 A1 | 6/2006 | Mochizuki ............. 250/370.09 |

FOREIGN PATENT DOCUMENTS

| | | |
|---|---|---|
| EP | 0 660 421 A2 | 6/1995 |
| JP | 8-116044 | 5/1996 |
| JP | 2003-218339 | 7/2003 |

* cited by examiner

*Primary Examiner*—David Porta
*Assistant Examiner*—Faye Boosalis
(74) *Attorney, Agent, or Firm*—Fitzpatrick, Cella, Harper & Scinto

(57) ABSTRACT

A reset method of a conversion element is improved, and the simplification of wiring and the improvement of an open area ratio of the conversion element by means of an image pickup apparatus including a plurality of pixels arranged on an insulating substrate, each of the pixels including a conversion element, a first switching element connected to the conversion element in order to transfer an electric signal obtained by the conversion element, and a second switching element connected to the conversion element in order to reset the conversion element by giving constant potential to the conversion element, wherein the second switching element includes a gate electrode, and a source electrode and a drain electrode, and one of the source electrode and the drain electrode is electrically connected to the gate electrode.

14 Claims, 18 Drawing Sheets

IMAGE PICKUP APPARATUS AND RADIATION IMAGE PICKUP APPARATUS

BACKGROUND OF THE INVENTION

1. Field of the Invention

The present invention relates to an image pickup apparatus converting an image into an electric signal, and more particularly to a radiation image pickup apparatus detecting a radiation such as an X-ray and a γ-ray. The radiation image pickup apparatus is applied to a medical image diagnostic apparatus, a nondestructive examination apparatus, an analyzer using a radiation, and the like.

2. Description of Related Art

Conventionally, the radiographing methods used by a medical image diagnosis are roughly classified into general radiography obtaining a still image and radioscopy radiography obtaining a moving image. Each radiographing method is selected including a radiographing apparatus as the need arises.

As the general radiography, i.e. a method of obtaining a still image, there is a method of using a screen and film system (hereinafter abbreviated to S/F), which combines a phosphor screen and a film, and fixing the film after exposing and developing the film. Alternatively, a method (computed radiography: hereinafter abbreviated to CR) of recording a radiation image on a photostimulable phosphor as a latent image, and, after that, of scanning the photostimulable phosphor with a laser to read output optical output information with a sensor is general. However, both of the methods severally have a defect such that the work flow for obtaining a radiation image is troublesome. Moreover, although the digitization of a radiation image is indirectly possible in both of the methods, both the methods lack immediacy. Furthermore, if the digitized environments of computer tomography (CT), magnetic resonance imaging (MRI) and the like, which are used by other medical image diagnoses, are taken into consideration, both of the methods cannot be said to be in a situation of having the sufficient consistency with CT, MRI and the like.

Moreover, an image intensifier (hereinafter abbreviated to I. I) using electronic tubes are mainly used for the radioscopy radiography, i.e. for a moving image. However, because the I. I uses the electronic tubes, the apparatus of the I. I becomes large in scale. Besides, the I. I has a small visual field region yet, namely the detection area thereof is small, and making the detection area to be a large one is anxious in the medical image diagnosis field. Furthermore, from the problem on the configuration of the apparatus, an obtained moving image has much crosstalk, and the improvement to a clear image is expected.

On the other hand, now that the progress of the liquid crystal thin film transistor (TFT) technology and the improvement of the information infrastructure are replete, a flat-panel detector (hereinafter abbreviated to FPD) has been proposed in Japanese Patent Laid-Open Publication No. H08-116044 and the like as a radiation image pickup apparatus combining a sensor array composed of photoelectric conversion elements using non-single crystalline silicon such as amorphous silicone (hereinafter abbreviated to a-Si) and switching TFT's, with phosphor converting a radiation into visible light or the like. By such a FPD, the possibility of digitization of a radiation image having a large area is coming Up.

The FPD can read a radiation image in an instant, and can display it on a display in an instant. Moreover, the image can be directly taken out as digital information. Consequently, the FPD has a feature such that the FPD is convenient to treat image data by saving, working and transferring the image data. Moreover, although various characteristics such as sensitivity depend on radiographing conditions, it is confirmed that the FPD has the various characteristics which are equal or more as compared with those of the conventional S/F system radiographing method and the CR radiographing method.

FIG. 16 is a schematic equivalent circuit diagram of the FPD.

In the diagram, a reference numeral 101 denotes a photoelectric conversion element unit. A reference numeral 102 denotes a transfer TFT. A reference numeral 103 denotes transfer TFT drive wiring. A reference numeral 104 denotes a signal line. A reference numeral 105 denotes sensor bias wiring. A reference numeral 106 denotes a signal processing circuit. A reference numeral 107 denotes a TFT drive circuit. A reference numeral 108 denotes an A/D converter.

A radiation such as an X-ray enters from the upper part of the sheet, and is converted into visible light by not-shown phosphor. The converted light is further converted into a charge by the photoelectric conversion element unit 101, and is accumulated in the photoelectric conversion element unit 101. After that, the TFT drive circuit 107 makes the transfer TFT 102 operate through TFT drive wiring to transfer the accumulated charge to the signal line 104, and then the signal processing circuit 106 processes the transferred charge. Furthermore, the A/D converter 108 performs the A/D conversion of the processed charge to output the converted digital data.

Basically, the element configuration mentioned above is general, and in particular, as the photoelectric conversion element, various elements such as a PIN type photodiode or an MIS type photo-sensor, which the present inventors adopt, have been proposed.

FIG. 17 is a schematic plan view of a pixel in the case where the MIS type photo-sensor is adopted as the photoelectric conversion element.

A reference numeral 201 denotes an MIS type photo-sensor. A reference numeral 202 denotes a transfer TFT. A reference numeral 203 denotes transfer TFT drive wiring. A reference numeral 204 denotes a signal line. A reference numeral 205 denotes sensor bias wiring. A reference numeral 211 denotes a transfer TFT gate electrode. A reference numeral 212 denotes transfer TFT source and drain electrodes (hereinafter abbreviated to SD electrodes). A reference numeral 213 denotes a contact hole.

Moreover, FIG. 18 shows a sectional view of schematically arranged each element in the pixel shown in FIG. 17. A reference numeral 301 denotes an insulating substrate such as a glass substrate. A reference numeral 302 denotes the transfer TFT drive wiring. A reference numeral 303 denotes the lower electrode of an MIS type photo-sensor. A reference numeral 304 denotes a transfer TFT gate electrode. A reference numeral 305 denotes a gate insulating film. A reference numeral 306 denotes an intrinsic a-Si film. A reference numeral 307 denotes a hole blocking layer. A reference numeral 308 denotes the sensor bias wiring. A reference numeral 309 denotes the SD electrodes of the transfer TFT. A reference numeral 310 denotes the signal line. A reference numeral 320 denotes a protective film. A reference numeral 321 denotes an organic resin layer. A reference numeral 322 denotes a phosphor layer.

As apparent from FIGS. 17 and 18, because the MIS type photo-sensor and the TFT, which is a transfer switching element, have the same layer configuration, the manufacturing method of the FPD is simple, and the FPD has an advantage in the possibility of the realization of a high yield and a low price. Moreover, the various characteristics of the FPD, such as the sensitivity thereof, are evaluated to be sufficiently satisfiable. Accordingly, as an apparatus to be used for general radiography now, the FPD mentioned above has resulted in being adopted in place of the conventional S/F method and the CR method.

However, although the FPD mentioned above has a large area and has achieved the complete digitization to be in the situation of being beginning to be mainly used for the general radiography, the FDP is in the situation of being insufficient in reading rate yet for the radioscopy radiography.

FIG. 19 is an equivalent circuit diagram of one bit of the FPD using the MIS type photo-sensor.

In the diagram, a reference character $C_1$ denotes the resultant capacity of the MIS type photo-sensor. A reference character $C_2$ denotes the parasitic capacity formed on the signal line. A reference character Vs denotes sensor bias potential. A reference character Vr denotes sensor reset potential. A reference character $SW_1$ denotes a Vs/Vr selector switch of the MIS type photo-sensor. A reference character $SW_2$ denotes an ON/OFF selector switch of the transfer TFT. A reference character $SW_3$ denotes a signal line reset switch. A reference character Vout denotes an output voltage.

The potential Vs is given to the MIS type photo-sensor through the switch $SW_1$ as the bias potential in order that the semiconductor layer may be depleted. In this state, when converted light from the phosphor enters the semiconductor layer, the positive charge prevented by the hole blocking layer is accumulated in the a-Si layer, and a potential difference Vt is generated. After that, an ON voltage of the transfer TFT is applied to the transfer TFT through the switch $SW_2$, and the voltage difference Vt is output as the output voltage Vout. The output voltage Vout is read by a not-shown readout circuit, and, after that, the signal wiring is reset by the switch $SW_3$. Thus, the readout is sequentially performed.

According to the drive method, the readout of the whole frame is completed by turning on the transfer TFT's one by one on every line (row). After that, the reset potential Vr is applied to the MIS type photo-sensor through the switch SW1 to perform the reset thereof. Then, the bias potential Vs is again applied, and the MIS type photo-sensor enters the image reading accumulation operation.

For example, in a FPD having a pixel size of 160 µm and a pixel region 43 cm×43 cm, the resultant capacity $C_1$ of a MIS type photo-sensor is about 1 pf, and the parasitic capacity $C_2$ thereof is about 50 pf. At this time, about 2% of transfer remainder is generated in the resultant capacity $C_1$ as a charge share at the time of the transfer. Accordingly, at the time of radiography, the reset operation mentioned above becomes indispensable in order to maintain image quality. Specifically, it is needed for about ten msec to several tens msec per frame to perform the reset operation. Naturally, the time is dependent on reset conditions. In other words, in order to realize the radioscopy radiography which needs to perform the high speed reading of 30 frames per second (hereinafter abbreviated to 30 FPS) or more, for a question for 1 second, it is necessary to perform reading processing, reset processing and the like of all lines in one frame of 33 msec (30 FPS).

FIG. 20 is a schematic view illustrating the drive method.

In the view, a reference character $T_1$ denotes the processing time of reading one line and the like. A reference character $T_2$ denotes the processing time reading all lines and the like. A reference character $T_3$ denotes the processing time of a reset and the like. A reference character T denotes the processing time of one frame.

As mentioned above, if the one-frame processing time T is required to be 33 msec or less and the processing time of a reset and the like $T_3$ is supposed to be 15 msec, then the processing time $T_2$ becomes 18 msec. If it is supposed that 1,500 lines are read, the processing time of reading and the like assigned to one line $T_1$ becomes 12 µsec. Moreover, if a radiation shooting exposure time, i.e. a sensor accumulation time is included, the processing time of reading and the like $T_1$ is further restricted. Consequently, it is necessary to improve the performance of the transfer TFT, and it leads to enlarging the size of the TFT at the sacrifice of the open area ratio thereof. Conversely, many problems, such as a fall of sensitivity, the deterioration of image quality, and an increase of a radiation dose, occur frequently.

That is, a high speed moving image drive and image quality are in a relation of a trade-off, and it is the situation that a high-definition high-speed moving image cannot be obtained under the present conditions.

In the above, although the case where the MIS type photo-sensor is used has been described, fundamentally, also in the case of using the PIN type photodiodes, processing time of a reset and the like is the problem of a moving image drive.

Accordingly, Japanese Patent Publication No. 2003-218339 discloses a FPD having a plurality of pixels, each including a conversion element converting a radiation into an electric signal, a signal transferring element connected to the conversion element, a resetting element applying predetermined potential to the conversion element to perform a reset operation, wherein both of the signal transferring element and the resetting element are connected to the pixel electrode of the conversion element. The disclosure aims to improve the sensor reset system in the conventional FPD and the open area ratio besides obtaining a large area and complete digitization not only in the general radiography but also in the radioscopy radiography to realize the secure high speed moving image reading, and thereby to provide a highly reliable radiation image pickup apparatus, in particular, to provide the optimum arrangement of sensor reset switches.

In the apparatus disclosed in Japanese Patent Publication No. 2003-218339, a reset is performed every line of a plurality of pixels; it became possible to reset the sensors of the lines which have already read during the readout of one line; the open area ratio is improved; and consequently a high speed moving image drive is realized. However, it is further desired to improve the open area ratio and to realize the improvement of the functions such as a secure high speed moving image drive at a low price.

SUMMARY OF THE INVENTION

It is an object of the present invention to aim to further improve the open area ratio by simplifying wiring at the time of realizing a high speed moving image reading by improving the sensor reset system.

A conversion element according to the present invention includes a plurality of pixels arranged on an insulating substrate, each of the pixels including a conversion element, a first switching element connected to the conversion element in order to transfer an electric signal obtained by the conversion element, a second switching element connected to the conversion element in order to reset the conversion element by giving constant potential to the conversion element, wherein the second switching element has a gate electrode, and a source electrode or a drain electrode, and the source electrode or the drain electrode is electrically connected to the gate electrode.

Moreover, a radiation image pickup apparatus according to the present invention includes a plurality of pixels arranged on an insulating substrate, each of the pixels including a conversion element converting an entered radiation into an electric signal according to the radiation, a first switching element connected to the conversion element in order to transfer the electric signal, a second switching element connected to the conversion element in order to reset the conversion element by giving constant potential to the conversion element, wherein the second switching element has a gate electrode, and a source electrode or a drain electrode, and the source electrode or the drain electrode is electrically connected to the gate electrode.

According to the present invention, a reset is performed every line of the plurality of pixels, and it becomes possible to reset the sensors of the lines the readout of which has been already completed during the readout of one line. At the same time, because the gate electrode and one of the source/drain electrodes are connected, a reset voltage is supplied through gate wiring. Thereby, the wiring is simplified to improve the open area ratio, and consequently the improvements of the functions thereof such as a high speed moving image drive can be realized at a low price.

DETAILED DESCRIPTION OF THE PREFERRED EMBODIMENTS

Below, the preferred embodiments of the present invention are described with reference to the attached drawings.

Hereinafter, although each embodiment is an example to which a radiation image pickup apparatus is applied as an FPD, Embodiments 1, 2 and 4 are also applicable as solid image pickup apparatus converting optical images other than radiations into electric signals. They can be applied to a solid image pickup apparatus in which pixels including signal conversion elements, transfer TFT's and reset TFT's are two-dimensionally arranged (in a matrix).

Embodiment 1

In the present embodiment, a radiation image pickup apparatus using the MIS type photo-sensors is described.

Figure 1:
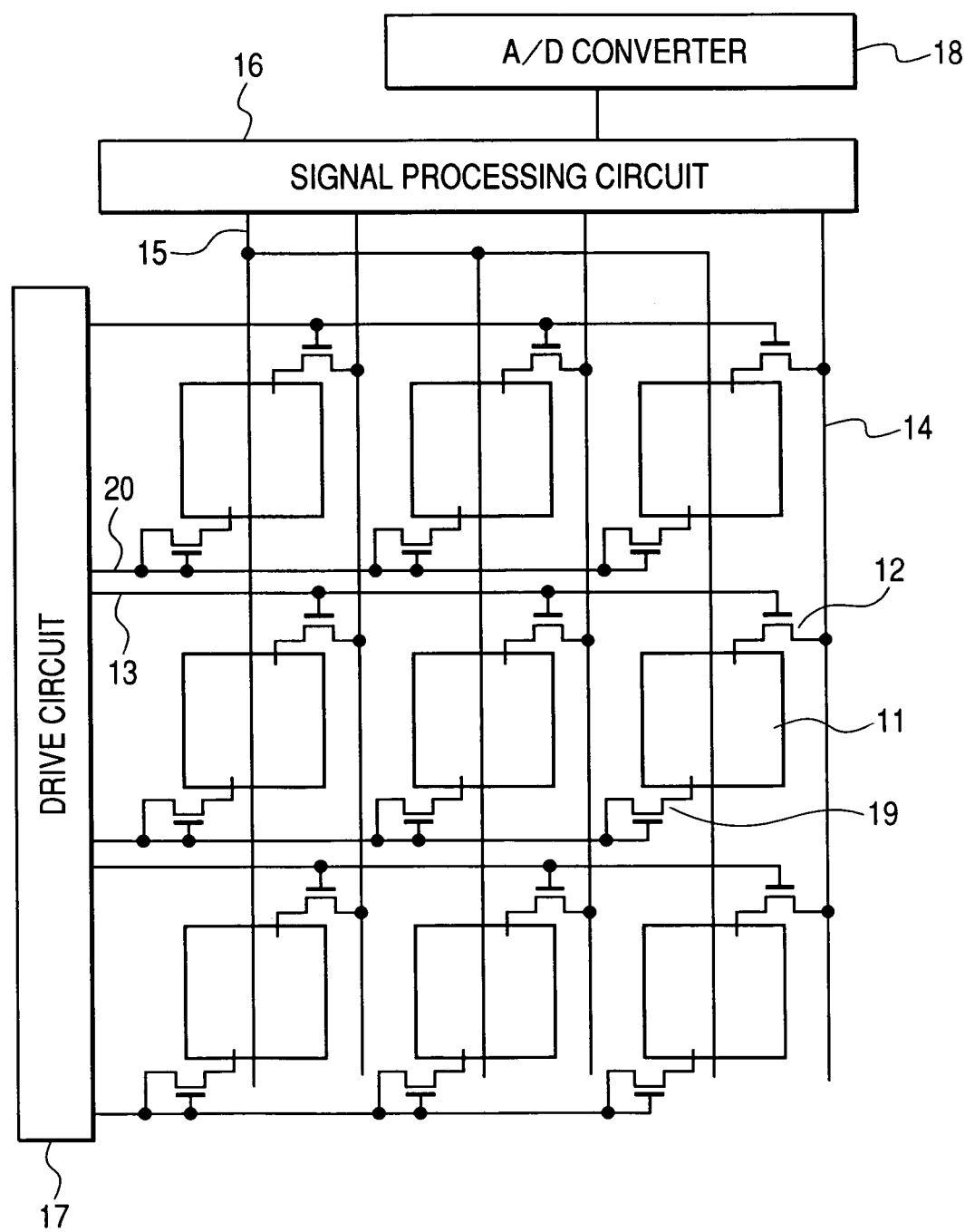
FIG. 1 is a schematic equivalent circuit diagram of 3×3 pixels in Embodiment 1 of the present invention.

FIG. 1 is a schematic equivalent circuit diagram of 3×3 pixels in the radiation image pickup apparatus of the present embodiment. In the diagram, a reference numeral 11 denotes a conversion element, which is an MIS type photo-sensor. A reference numeral 12 denotes a transferring switching element such as a TFT. A reference numeral 13 denotes drive wiring of the transferring switching element 12. A reference numeral 14 denotes signal wiring. A reference numeral 15 denotes sensor bias wiring. A reference numeral 16 denotes a signal processing circuit. A reference numeral 17 denotes a drive circuit. A reference numeral 18 denotes an A/D converter. A reference numeral 19 denotes a resetting switching element such as a TFT. A reference numeral 20 denotes drive wiring of the resetting switching element 19.

A radiation such as an X-ray is converted into visible light by a not-shown wavelength converter, and enters the conversion element 11. The wavelength converter is a scintilator such as CsI or GOS. The entered light is photoelectrically converted by the conversion element 11, and the signal charge is accumulated in the conversion element 11. After that, by turning on the transferring switching element 12, an image signal according to the signal charge is read. After that, by turning on the resetting switching element 19, the conversion element is reset.

Figure 2:
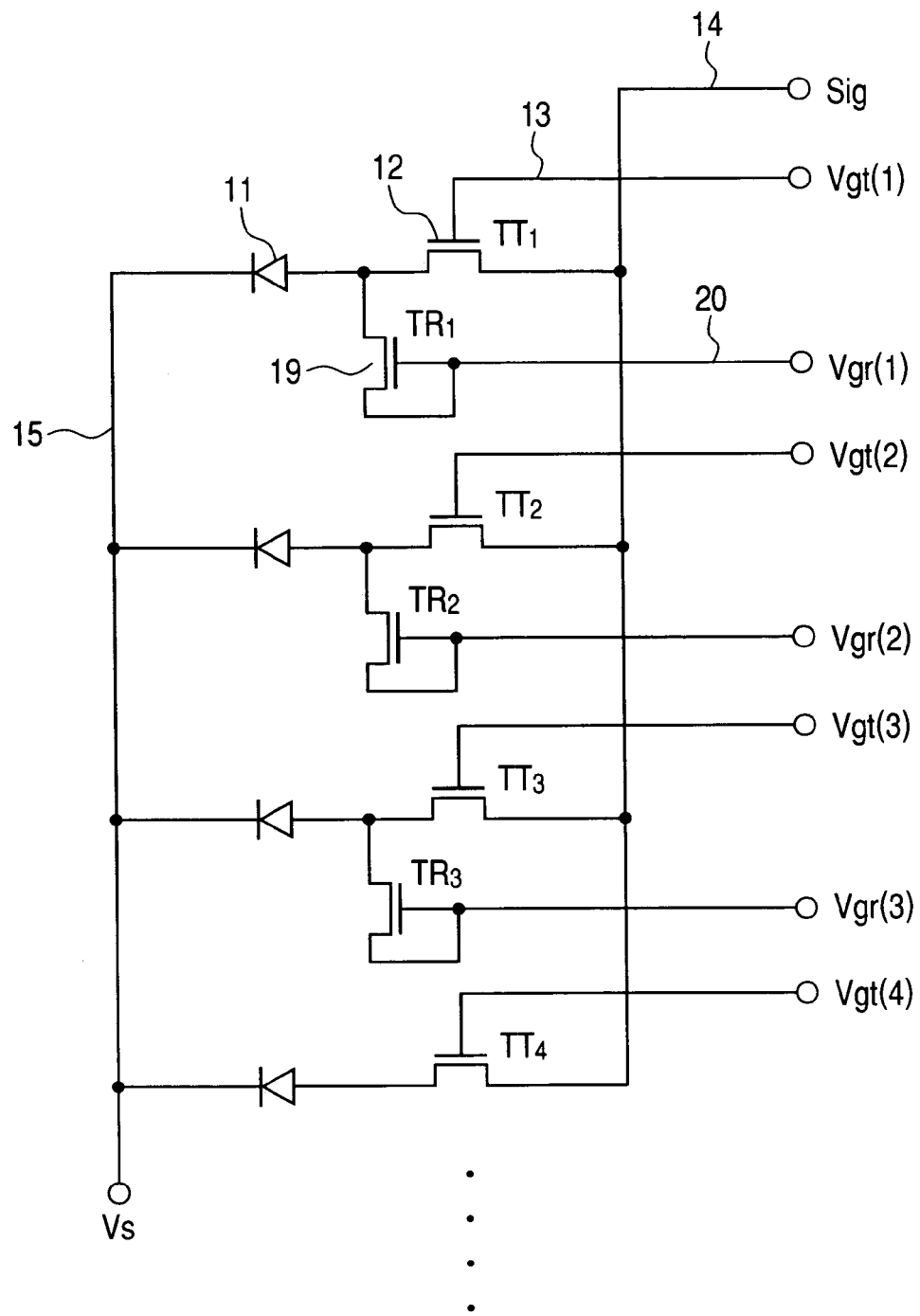
FIG. 2 is an equivalent circuit diagram of 3×1 pixels in Embodiment 1 of the present invention.

FIG. 2 is an equivalent circuit diagram of 3×1 pixels of the radiation image pickup apparatus in the present embodiment. In the diagram, the reference numerals are the same as those of FIG. 1. An ON voltage of the transferring switching element ($TT_1$) is applied by Vgt(1), and the signal charge is output as the image signal through the signal wiring 14. Next, an ON voltage of the resetting switching element ($TR_1$) is applied by Vgr(1), and the conversion element 11 is reset. Similarly, an ON voltage of the next transferring switching element ($TT_2$) is applied by Vgt(2), and the signal charge is output through the signal wiring 14. Next, an ON voltage of the resetting switching element (TR2) is applied from Vgr(2), and the conversion element 11 is reset. By repeating the above operations from the upper part of the sheet to the lower part thereof in FIG. 2, moving image reading becomes possible.

Figure 3:
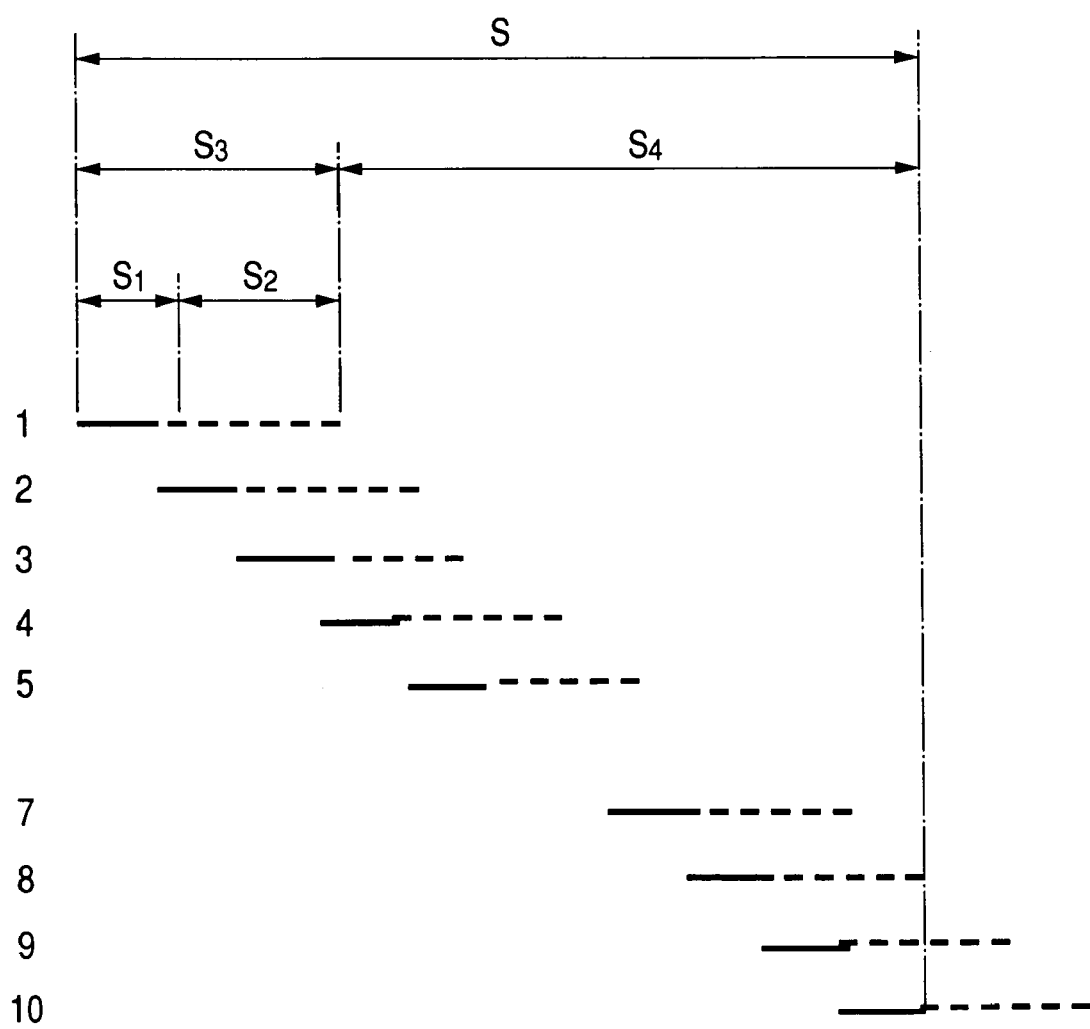
FIG. 3 is a schematic view illustrating a drive method in Embodiment 1 of the present invention.

FIG. 3 is a schematic view illustrating the drive method in the present embodiment. In the view, a reference character $S_1$ denotes a readout processing and the like time of one line. A reference character $S_2$ denotes a reset processing and the like time of one line. A reference character $S_3$ denotes a transfer, reset processing and the like time of one line. A reference character $S_4$ denotes an accumulation time of the conversion elements of one line. A reference numeral character S denotes a one-frame processing time.

When the present embodiment is compared with the conventional method of resetting all conversion elements collectively after sequential readout and of repeating radiation shooting exposures, the present embodiment can perform readout, reset of the conversion elements, and accumulation every line. Therefore, substantially, the present embodiment can drive by the total of readout times. That is, while one line is receiving a readout operation, the sensors of the already read lines are reset. Consequently, the present embodiment can realize a high speed moving image drive of 30 FPS or more without deteriorating image quality.

Moreover, the gate electrode of the resetting switching element and one of the source and drain electrodes are directly connected, and the reset potential Vrr of the pixel electrode of a conversion element is given. That is, because the gate electrode and one of the source and drain electrodes of the resetting switching element are in a direct coupling structure, there is no necessity of further arranging the reset wiring which gives the reset potential Vrr. Consequently, it becomes possible to prevent the deterioration of the open area ratio. Moreover, the reset potential Vrr may be composed of a plurality of pieces of potential. For example, the reset potential Vrr may be composed of a plurality of pieces of potential, i.e. a plurality of drive voltages of the resetting switching elements, such as applying the high potential Vrr in order to reset the conversion elements sufficiently, and, after that, applying predetermined reset potential Vrr for accumulation.

Figure 4:
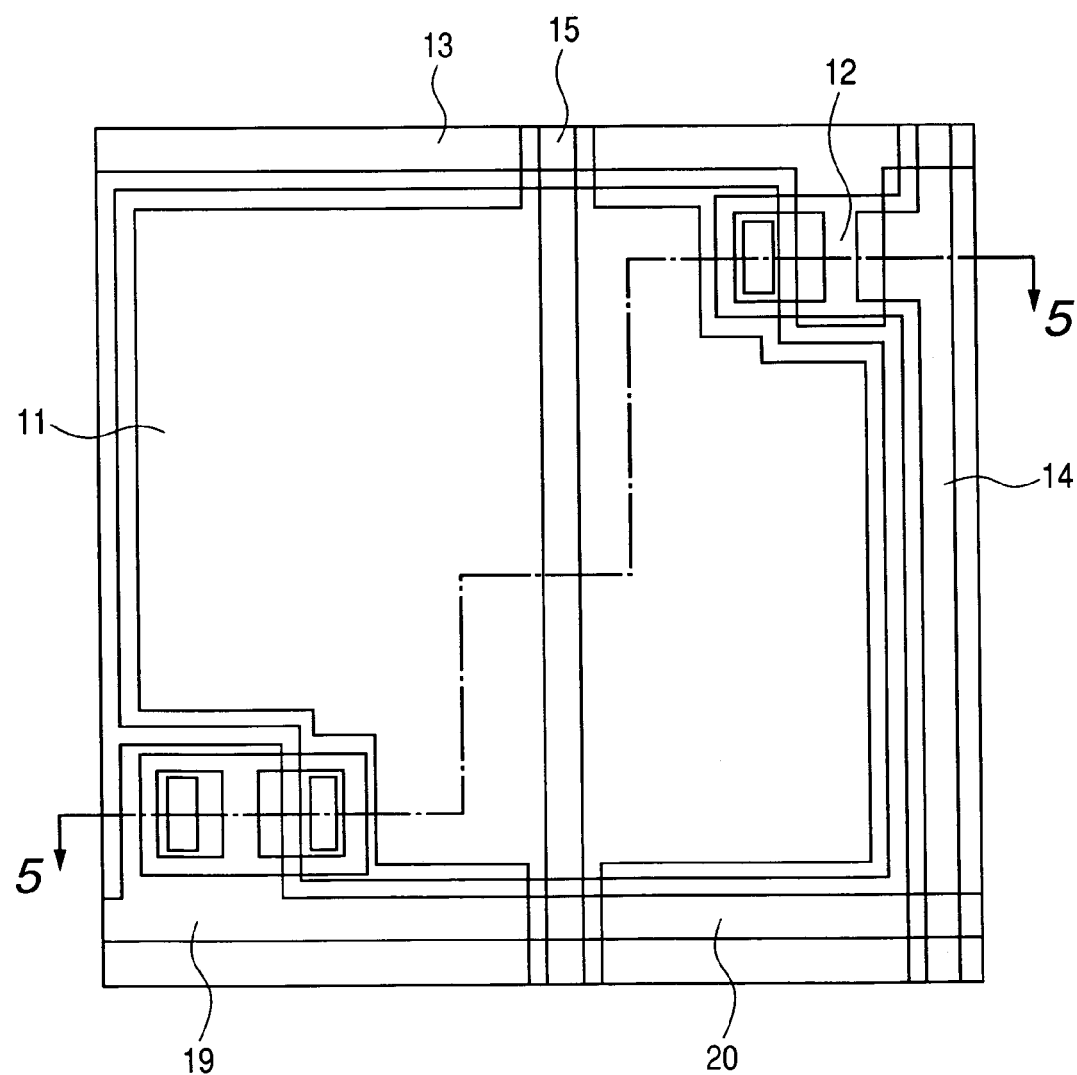
FIG. 4 is a plan view of a pixel of Embodiment 1 of the present invention.

FIG. 4 is a plan view of a pixel of the present embodiment. In the view, reference numerals are the same as those in FIG. 1. The transferring switching element 12 and the resetting switching element 19 are arranged at the diagonal positions of the pixel in view of the improvement of efficiency of the layouts of the drive wiring, the signal wiring and the like.

Figure 5:
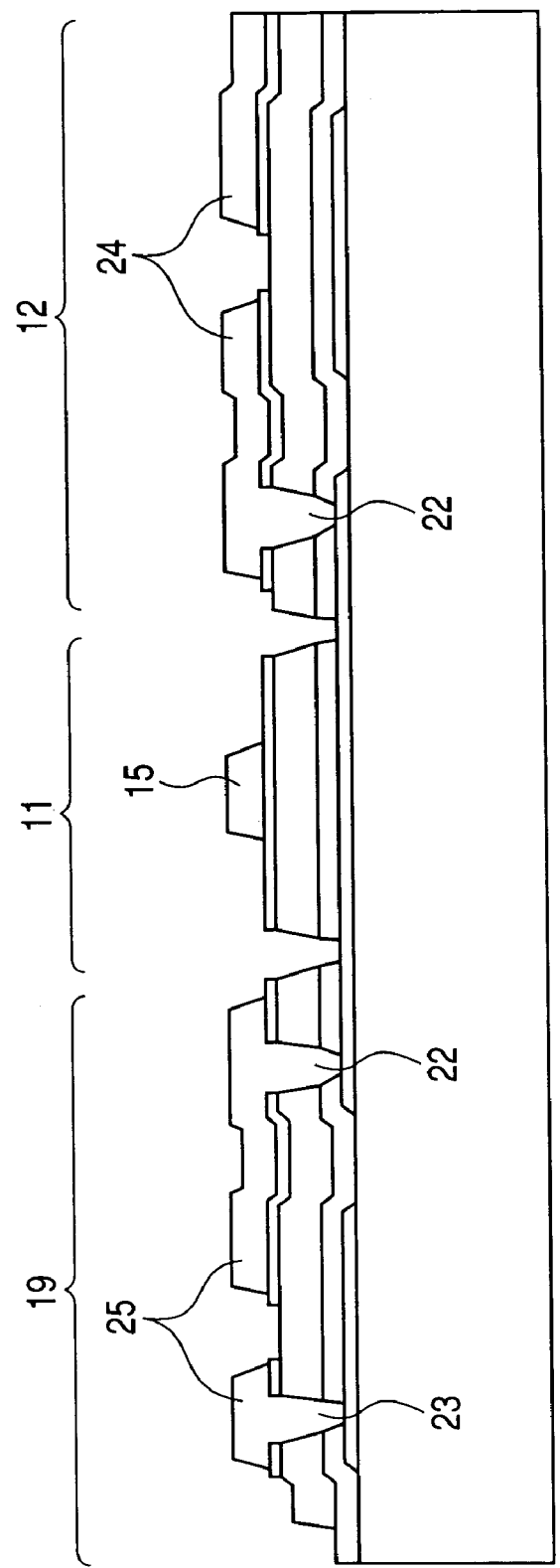
FIG. 5 is a schematic sectional view taken along a line 5-5 in FIG. 4.

FIG. 5 is a schematic sectional view of along a line 5-5 in FIG. 4.

Next, a manufacturing method of the FPD of the present embodiment is described. FIGS. 6A to 6D are views illustrating the manufacturing method of the FPD in the present embodiment.

Figure 6A:
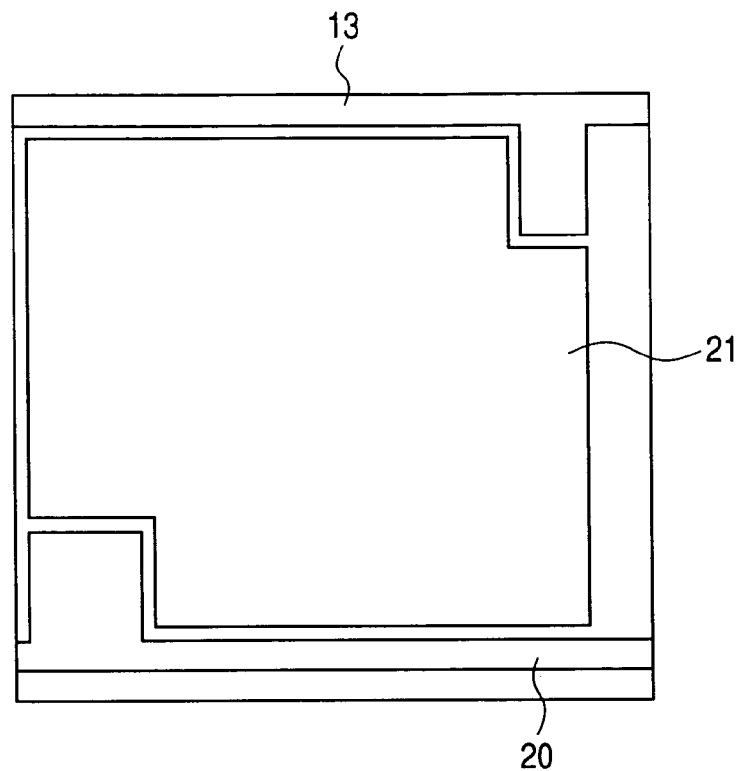
FIGS. 6A, 6B, 6C and 6D are views illustrating a manufacture method in Embodiment 1 of the present invention.

At a first process, on an insulating substrate such as a glass substrate, the drive wiring 13 of a transferring switching element being a TFT, the gate electrode of the transferring switching element, the pixel electrode 21 of the conversion element which is an MIS type photo-sensor, the drive wiring 20 of a resetting switching element which is a TFT, and a chromium thin film as the gate electrode of the resetting switching element are formed to be films with a sputter apparatus, and a pattern is formed by the photolithography. A schematic plan view of a pixel is shown in FIG. 6A.

At a second process, a gate insulating film made of SiN, a semiconductor layer made of an a-Si film, and a impurity semiconductor layer made of a phosphor-doped n+ film of the transferring switching element and the resetting switching element; which are the TFT, and of the conversion element being the MIS type photo-sensor are severally formed as a film with a plasma CVD apparatus.

Figure 6B:
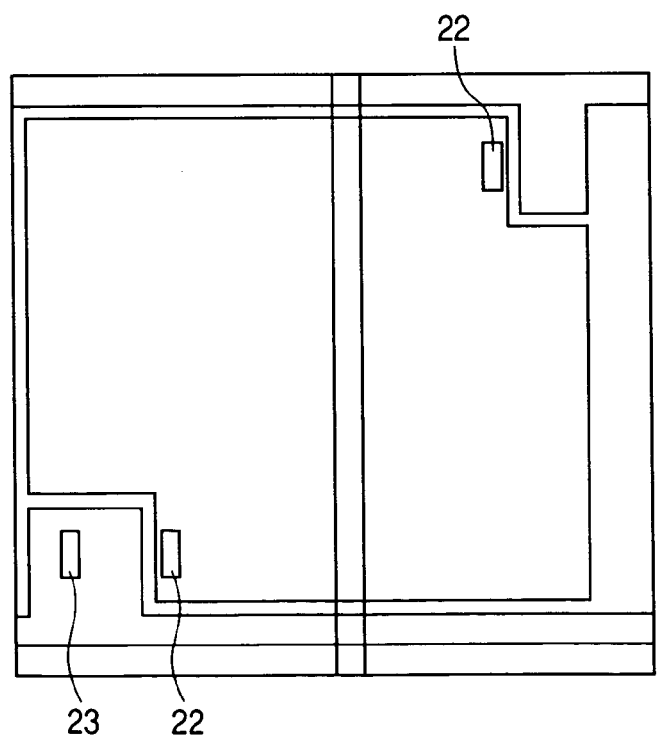

At a third process, contact holes 22 and 23 are formed by the photolithography using reactive ion etching (RIE) or chemical dry etching (CDE). A schematic plan view of the pixel is shown in FIG. 6B.

Figure 6C:
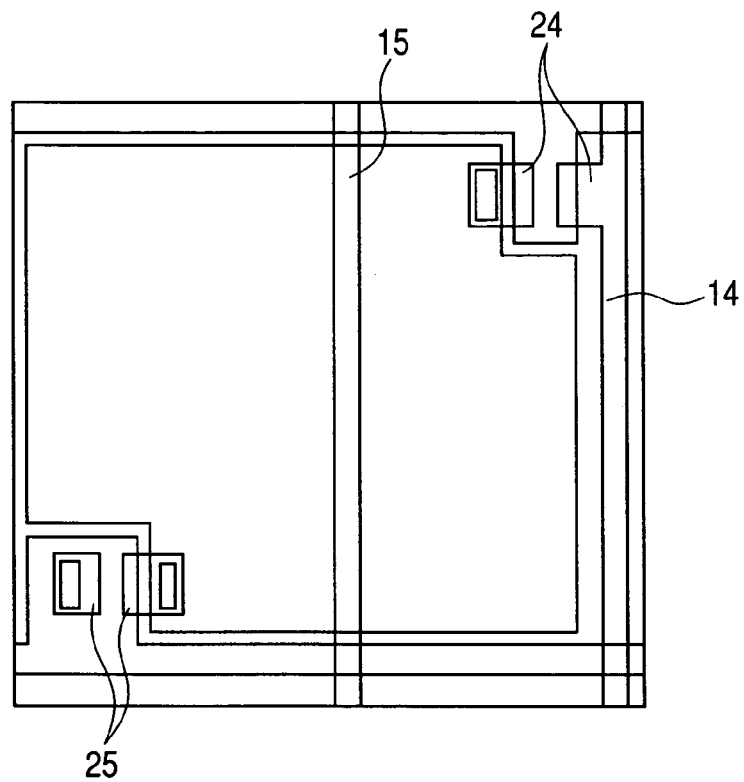

At a fourth process, an aluminum thin film of one μm in thickness is formed as film with the sputter apparatus as the SD electrodes 24 and 25 of the transferring switching element and the resetting switching element, which are TFT's, the signal wiring 14, and the sensor bias wiring 15. Then, a pattern is formed by the photolithography. A schematic plan view of the pixel is shown in FIG. 6C.

At a fifth process, the impurity semiconductor layers of the gap portions of the transferring switching element and the resetting switching element, which are the TFT's are removed with the RIE.

Figure 6D:
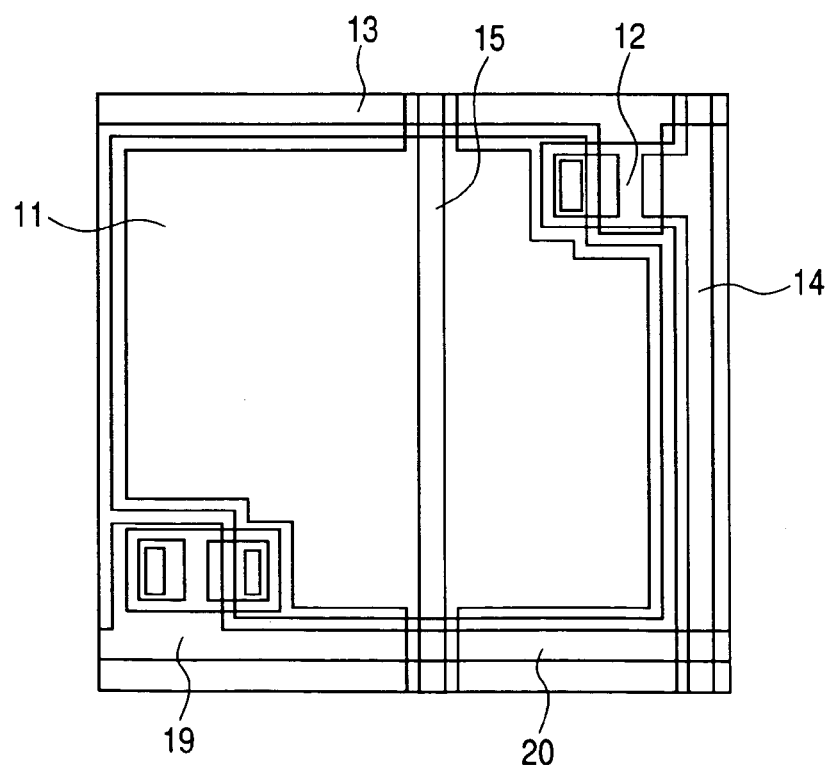

At a sixth process, the separation of elements of each element is preformed by the photolithography using the RIE. A schematic plan view of the pixel is shown in FIG. 6D.

At a seventh process, a SiN film is formed as a film with the plasma CVD apparatus as a protective film, and a wire leading portions and the like are exposed by the photolithography using the RIE.

At an eighth process, a scintillator is arranged on the conversion element by pasting together with an adhesive, or the like. The FPD of the present invention is manufactured by the above.

Embodiment 2

The present embodiment is for improving the sensitivity in comparison with the previous Embodiment 1, in other words, for improving the open area, and for simplifying the TFT drive circuit.

Figure 7:
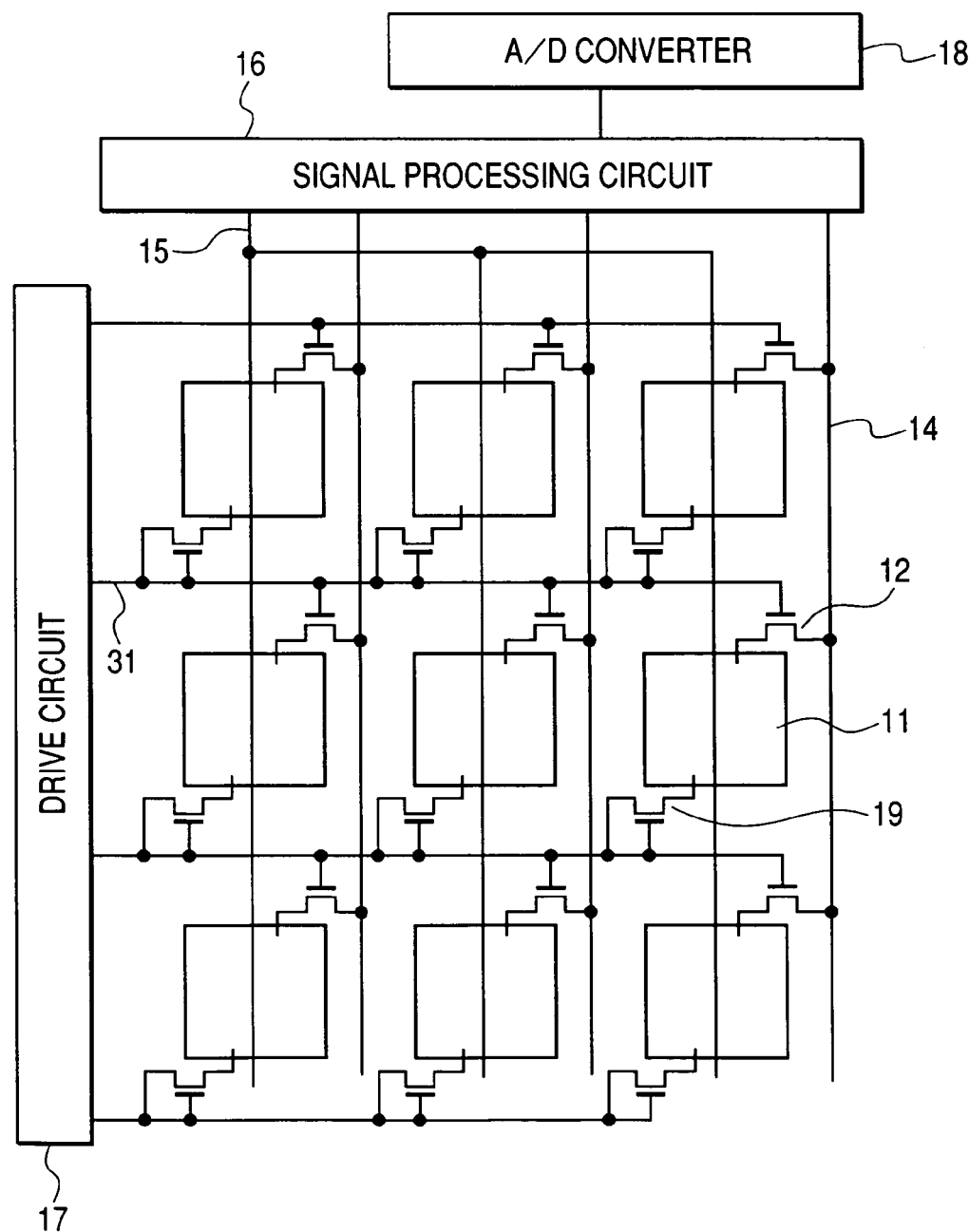
FIG. 7 is a schematic equivalent circuit diagram of 3×3 pixels in Embodiment 2 of the present invention.

FIG. 7 is a schematic equivalent circuit diagram of 3×3 pixels in the present embodiment. In the diagram, a reference numeral 11 denotes a conversion element, which is an MIS type photo-sensor. A reference numeral 12 denotes a transferring switching element, which is composed of a TFT. A reference numeral 31 denotes drive wiring for driving the transferring switching element 12 and the resetting switching element driving. A reference numeral 14 denotes signal wiring. A reference numeral 15 denotes sensor bias wiring. A reference numeral 16 denotes a signal processing circuit. A reference numeral 17 denotes a drive circuit. A reference numeral 18 denotes an A/D converter. A reference numeral 19 denotes the resetting switching element, which is composed of a TFT.

An X-ray is converted into visible light by a not-shown phosphor, and enter the conversion element 11. The incident light is photoelectrically converted, and a signal charge is accumulated into the conversion element 11. After that, by turning on the transferring switching element 12, an image signal according to the signal charge is read. After that, at the timing when the transferring switching element at the subsequent stage operates, the switching element 19 is turned on, and the conversion element 11 is reset.

Figure 8:
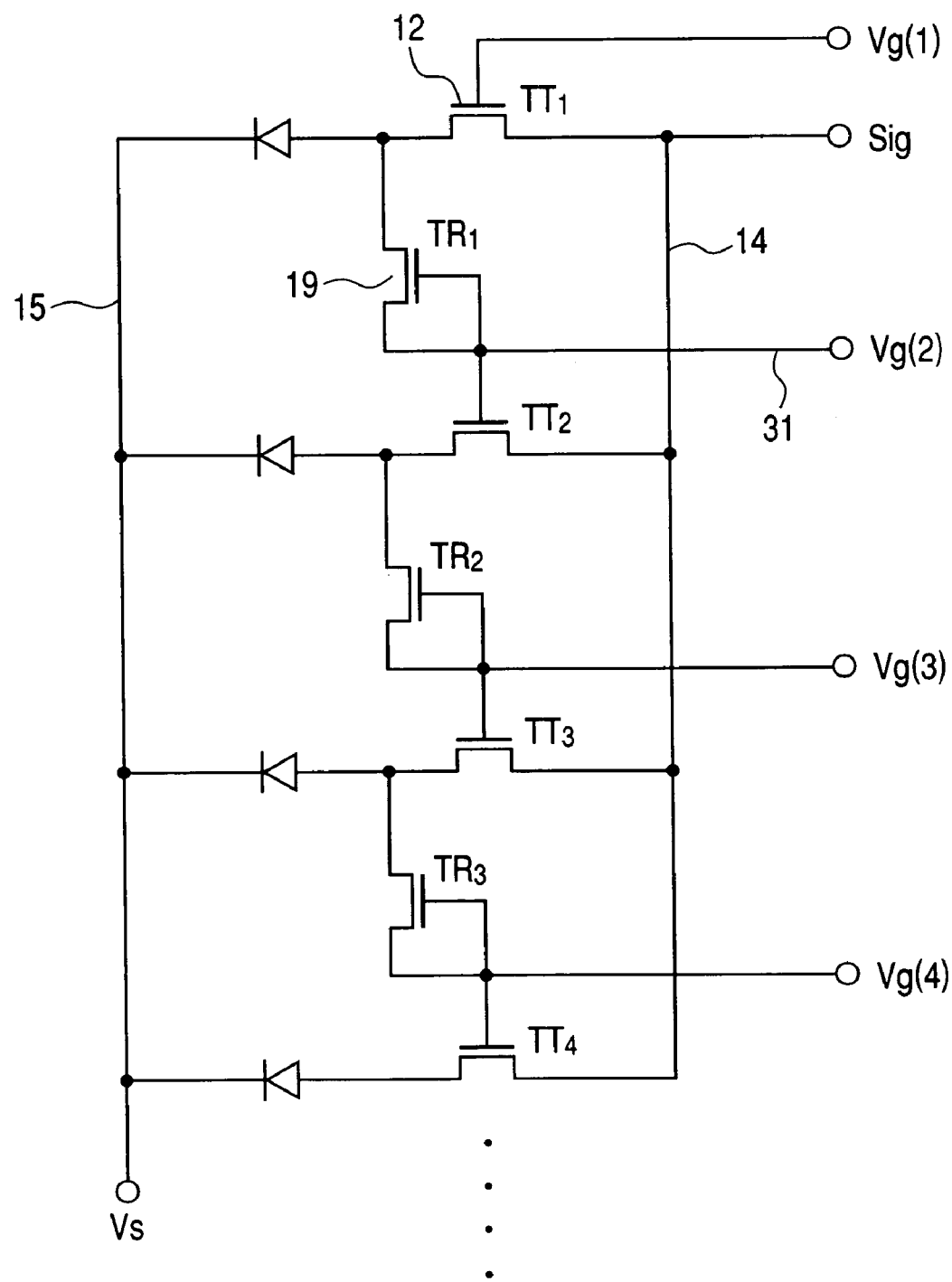
FIG. 8 is an equivalent circuit diagram of 3×1 pixels in Embodiment 2 of the present invention.

Next, FIG. 8 is an equivalent circuit diagram of 3×1 pixels in the present embodiment. In the diagram, the reference characters are the same as those in FIG. 2. An ON voltage of the transferring switching element ($TT_1$) is applied by Vg(1), and the signal charge is output as the image signal through the signal wiring 14. Next, an ON voltage of the resetting switching element ($TR_1$) is applied from Vg(2), and the conversion element 11 is reset. At this time, simultaneously, an ON voltage is applied to the transferring switching element ($TT_2$), and the next image signal is output through the signal wiring 14 similarly. Next, an ON voltage of the resetting switching element (TR2) is applied from Vg(3), and the conversion element 11 is reset. By repeating the above operations, moving image reading becomes possible.

Figure 9:
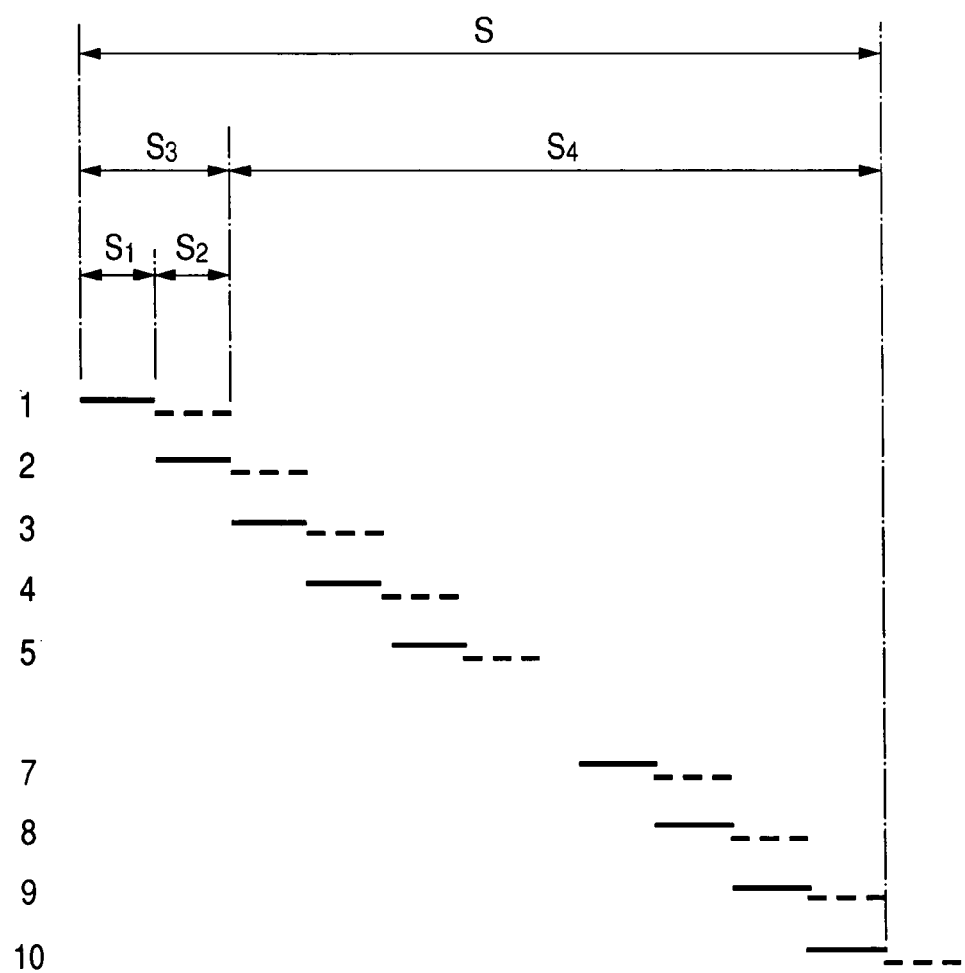
FIG. 9 is a schematic view illustrating a drive method in Embodiment 2 of the present invention.

FIG. 9 is a schematic view illustrating the drive method in the present embodiment. In the view, a reference character $S_1$ denotes a readout processing and the like time of one line. A reference character $S_2$ denotes a reset processing and the like time of one line. A reference character $S_3$ denotes a transfer, reset processing and the like time of one line. A reference character $S_4$ denotes an accumulation time of the conversion elements of one line. A reference numeral character S denotes a one-frame processing time.

When the present embodiment is compared with the conventional method, the present embodiment performs readout, reset and accumulation every line. Therefore, substantially, the present embodiment can drive by the total of readout times as for the readout time per image. As a result, the present embodiment can realize a high speed moving image drive of 30 FPS or more without deteriorating image quality. That is, the features of the present embodiment are the configuration in which the resetting switching element at the preceding stage and the transferring switching element at the subsequent stage are simultaneously turned on through the same drive wiring at the same time as mentioned above, and the structure in which the gate electrode and one of the source and drain electrodes of the resetting switching element are directly connected to each other. Therefore, though the present embodiment has the structure of having two switching elements in a pixel, the present embodiment can realize the same wiring number as that of the structure of having one switching element in a pixel. Consequently, the improvement of the functions thereof can be achieved without reducing the open area ratio.

Figure 10:
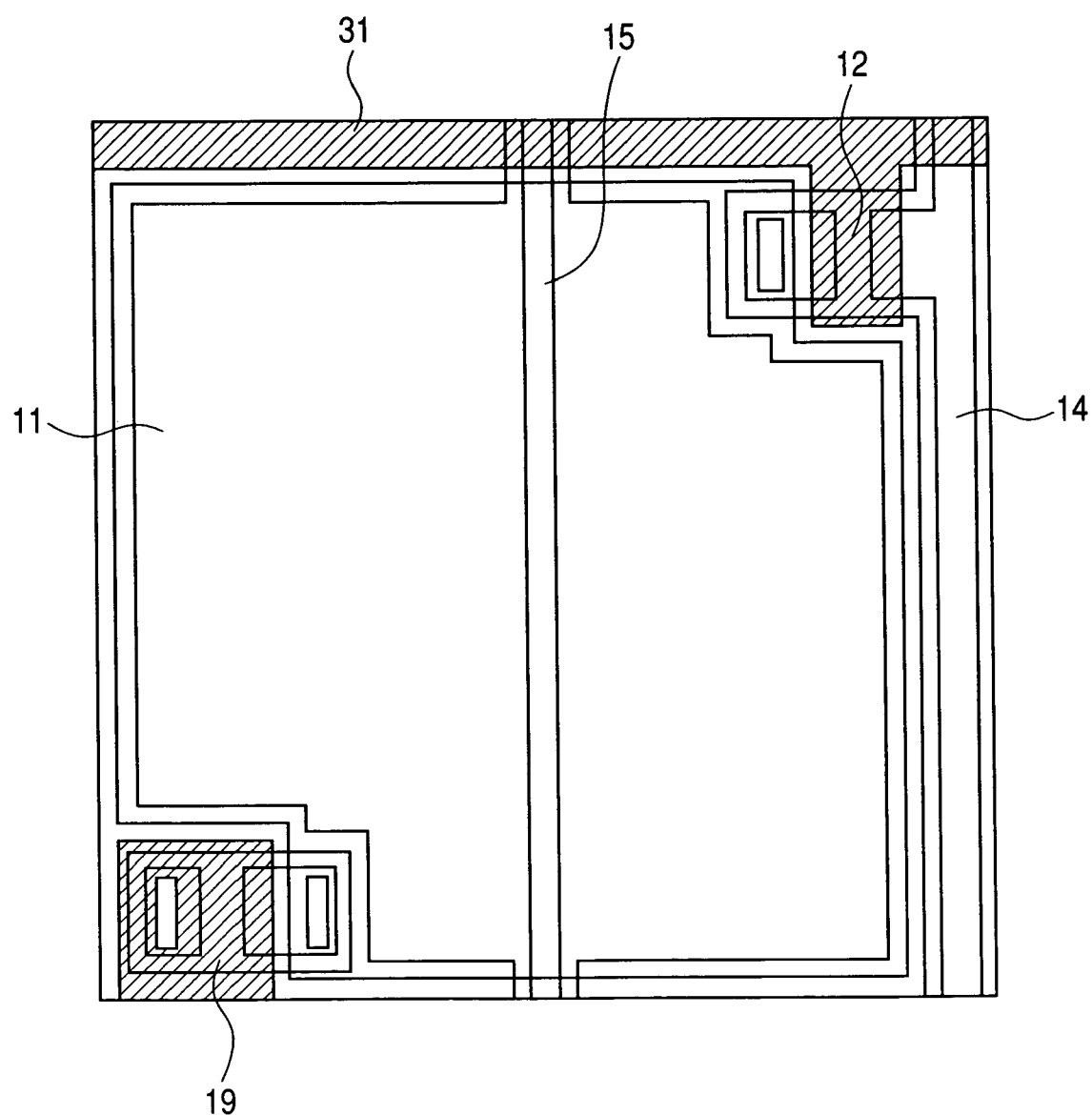
FIG. 10 is a plan view of a pixel of Embodiment 2 of the present invention.

FIG. 10 is a plan view of one pixel in the present embodiment. In the view, the reference numerals are the same as those of FIG. 7. The transferring switching element 12 and the resetting switching element 19, which are composed of TFT's, are arranged in the diagonal position of the pixel on the layout of drive wiring, signal wiring and the like. Moreover, from the feature on structure, because the operating times of the transferring switching element and the resetting-switching element are the same, the operation performance of each of them are not necessarily the same, and it is necessary to perform operations on at least two kinds of operation voltages.

Figure 11:
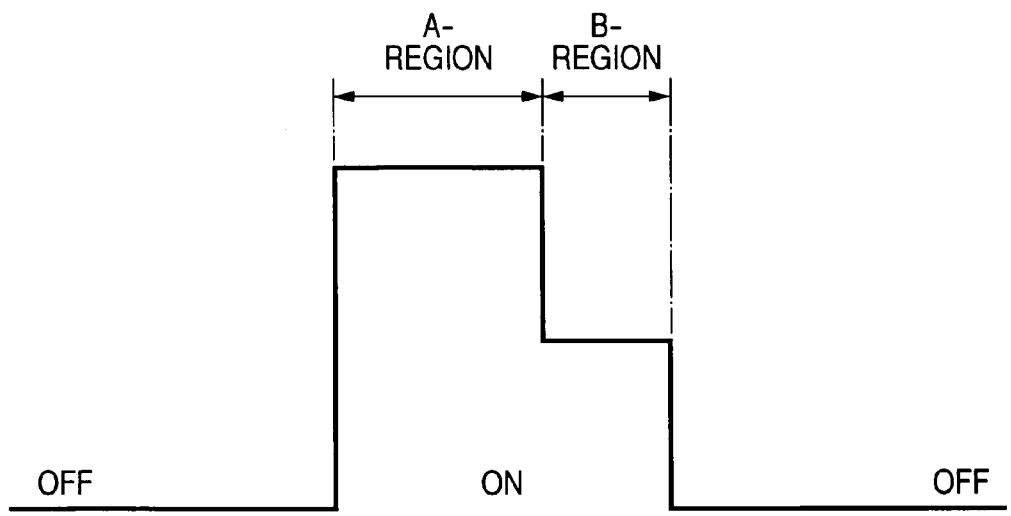
FIG. 11 is a view illustrating an operation voltage profile of a TFT in Embodiment 2 of the present invention.

FIG. 11 is a view showing an example of the operation voltage profile of a TFT used as each switching element. In the view, an A-region is a voltage considered for the transferring switching element, and a B-region is a voltage considered for the resetting switching element. The operation voltage profile is for making the lower electrode of the MIS type photo-sensor which is a conversion element be at the predetermined potential Vrr, as described in Embodiment 1. It is of course that it is not necessary to be step-like so that it may finally become a predetermined voltage. Basically, the operation voltage profile may be the one enabling the resetting switching element to realize a predetermined voltage following a voltage profile operating the transferring switching element.

The present embodiment has the same number of drive wires for driving the switching elements as that of the conventional FPD. Consequently, without changing the peripheral circuits greatly, the high speed moving image is enabled, and the manufacturing method thereof is also simple like Embodiment 1.

Embodiment 3

A case where the present embodiment is applied to the so-called direct conversion system is described. In the direct conversion system, a radiation is directly converted by a radiation direct conversion unit, and the converted charge is accumulated to be read with a transferring switching element.

Figure 12:
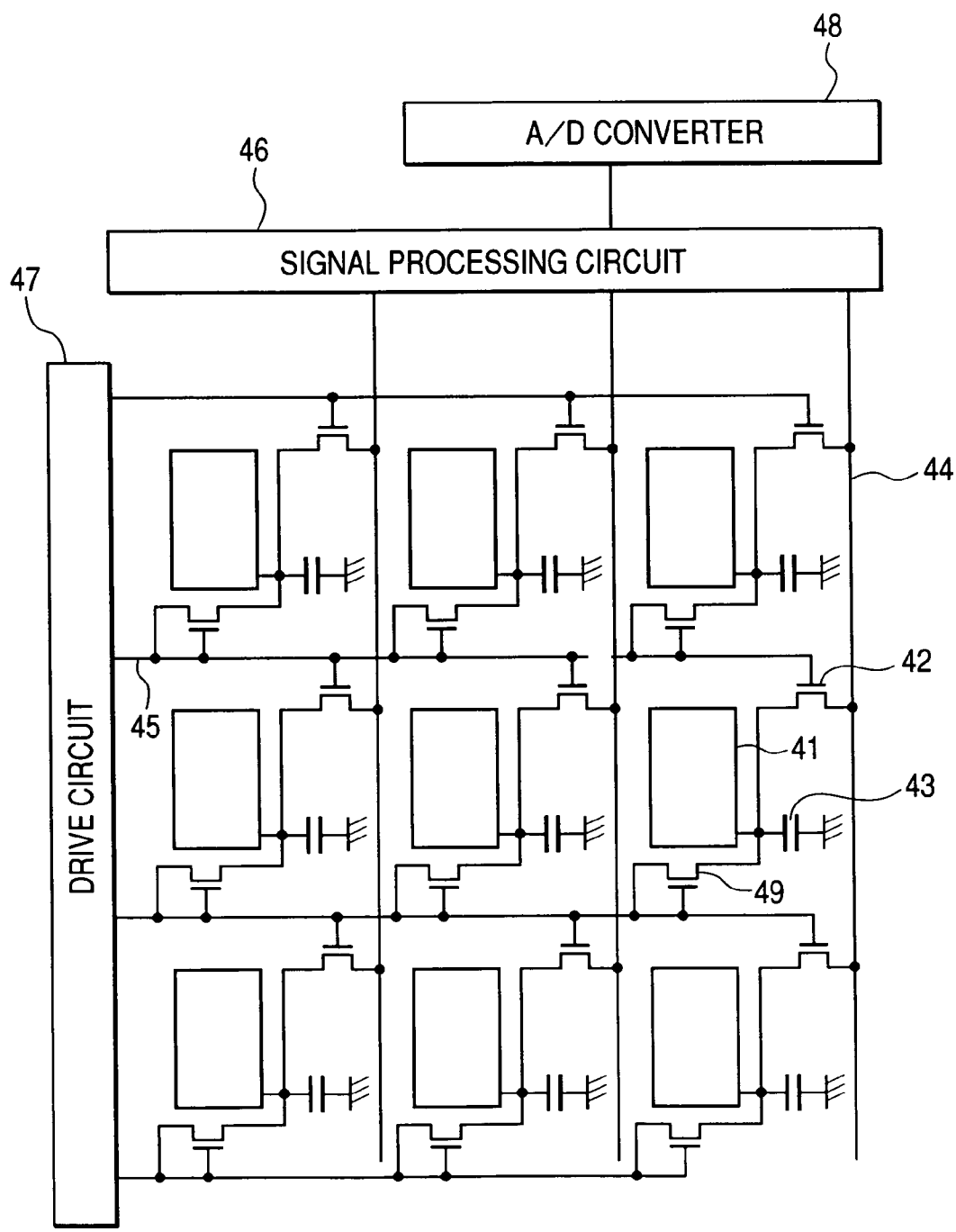
FIG. 12 is a schematic equivalent circuit diagram of 3×3 pixels in Embodiment 3 of the present invention.

FIG. 12 is a schematic equivalent circuit diagram of 3×3 pixels in the present embodiment. In the diagram, a reference numeral 41 denotes an individual electrode collecting charges generated in a conversion element converting a radiation directly. A reference numeral 43 denotes accumulation capacity. A reference numeral 12 denotes a transferring switching element composed of a TFT. A reference numeral 45 denotes drive wiring for driving the transferring switching element 42 and resetting switching element. A reference numeral 44 denotes signal wiring. A reference numeral 46 denotes a signal processing circuit. A reference numeral 47 denotes a drive circuit. A reference numeral 48 denotes an A/D converter. A reference numeral 49 denotes a resetting switching element composed of a TFT.

Figure 13:
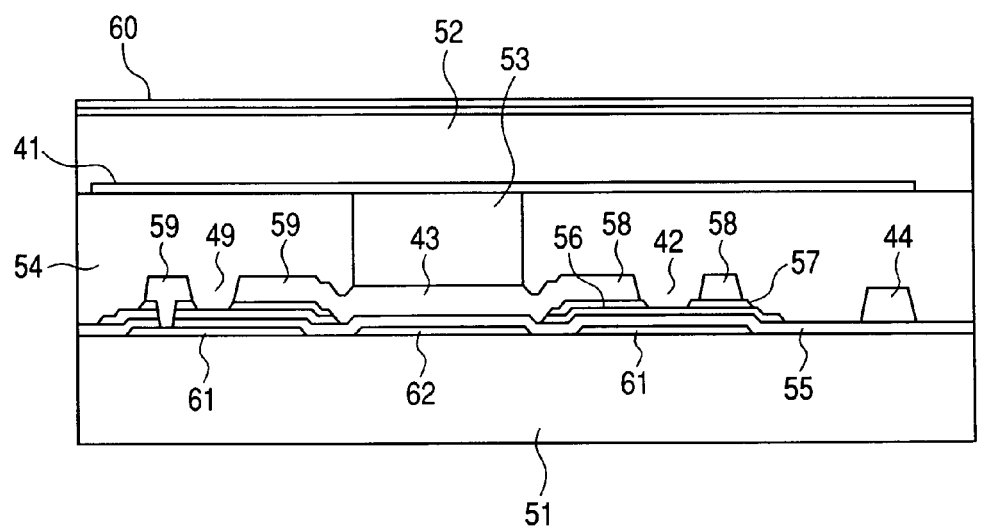
FIG. 13 is a schematic sectional view in Embodiment 3 of the present invention.

FIG. 13 shows a schematic sectional view in the present embodiment. A reference numeral 51 denotes an insulating substrate such as a glass substrate. A reference numeral 52 denotes GaAs being a conversion element converting a radiation directly. A reference numeral 60 denotes a common electrode. A reference numeral 41 denotes an individual electrode. Moreover, a reference numeral 53 denotes a bump connection portion with a conductive resin. A reference numeral 61 denotes a gate electrode of the transferring switching element and the resetting switching element. Reference numerals 55, 56 and 57 denote a gate insulating film, a semiconductor layer and an impurity semiconductor layer of both the switching elements, respectively. A reference numeral 62 denotes the lower electrode of the accumulation capacity 43. A reference numeral 54 denotes an interlayer insulation film. Reference numerals 58 and 59 denote the source and drain electrodes of the transferring switching element and the resetting switching element.

An X-ray is directly converted into a charge by the conversion element 52, and is collected by the individual electrode 41 to be accumulated in the accumulation capacity 43 through the bump connection portion 53. After that, the accumulated charge is read from the signal wiring 44 by turning on the transferring switching element 42. After that, the resetting switching element 49 is turned on at the time when the transferring switching element 42 at the subsequent stage is turned on, and the conversion element and the accumulation capacity are reset. Incidentally, amorphous selenium may be used as the radiation direct conversion unit.

Also in the present embodiment, there are the same effects as those of Embodiments 1 and 2, and a high-definition moving image can be easily obtained.

Embodiment 4

In the present embodiment, an X-ray detection apparatus using a PIN type photodiode as a conversion element is described. The same effects as those of the case of using an MIS type photo-sensor can be obtained. The present embodiment has a structure in which the PIN type photodiodes are laminated on an array of switching elements composed of TFT's. The equivalent circuit thereof is the same as that of Embodiment 2, and has the structure in which a transferring switching element and a resetting switching element in the preceding line are connected with each other with the same drive wiring.

Figure 14:
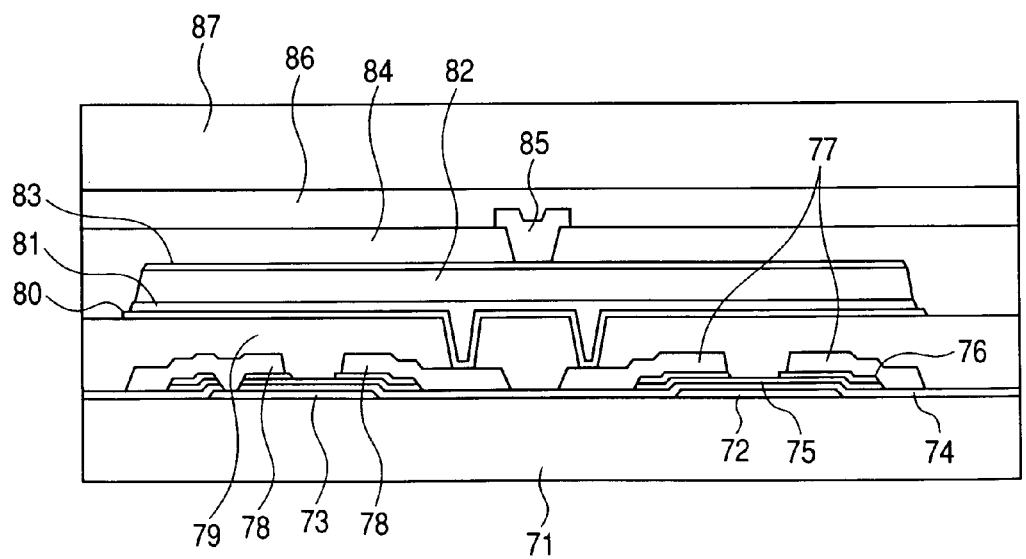
FIG. 14 is a schematic sectional view in Embodiment 4 of the present invention.

FIG. 14 is a schematic sectional view in the present embodiment. In the view, a reference numeral 71 denotes an insulating substrate such as a glass substrate. A reference numeral 72 denotes a gate electrode of a TFT which is a transferring switching element. A reference numeral 73 denotes a gate electrode of a TFT which is a resetting switching element. A reference numeral 74 denotes a gate insulating film. A reference numeral 75 denotes a semiconductor layer made of a-Si. A reference numeral 76 denotes an impurity semiconductor layer. Reference numerals 77 and 78 denote the source or drain electrodes of the transferring switching element and the resetting switching element. A reference numeral 79 denotes an interlayer insulation film. A reference numeral 80 denotes the lower electrode of a conversion element. A reference numeral 81 denotes an n layer. A reference numeral 82 denotes an i layer. A reference numeral 83 denotes a p layer. A reference numeral 84 denotes a protective film. A reference numeral 85 denotes sensor bias wiring. A reference numeral 86 denotes protective film. A reference numeral 87 denotes phosphor.

In the present embodiment, in consideration of the operation of the resetting switching element, an NIP structure is adopted from the lower electrode of a conversion element, and the present embodiment has a structure limited from the drive method. Moreover, because the present embodiment has a laminated structure, it is basically possible to arrange a conversion element on wiring or a switching element, and to achieve a high open area ratio. On the other hand, the present embodiment has a low dielectric constant, and parasitic capacity is reduced by arranging a thick interlayer insulation film. Consequently, there is a problem in realizing a low price owing to the restriction of material, the restriction of the formation of a thick film, and the like. However, by reducing the number of wires as in the present embodiment, the reduction of the parasitic capacity can be attained, and the degree of freedom of the design of an interlayer insulation film becomes larger. Moreover, the parasitic capacity is also reduced, and the achievement of the improvement of functions and the lowering of the price can be simultaneously achieved.

Embodiment 5

Figure 15:
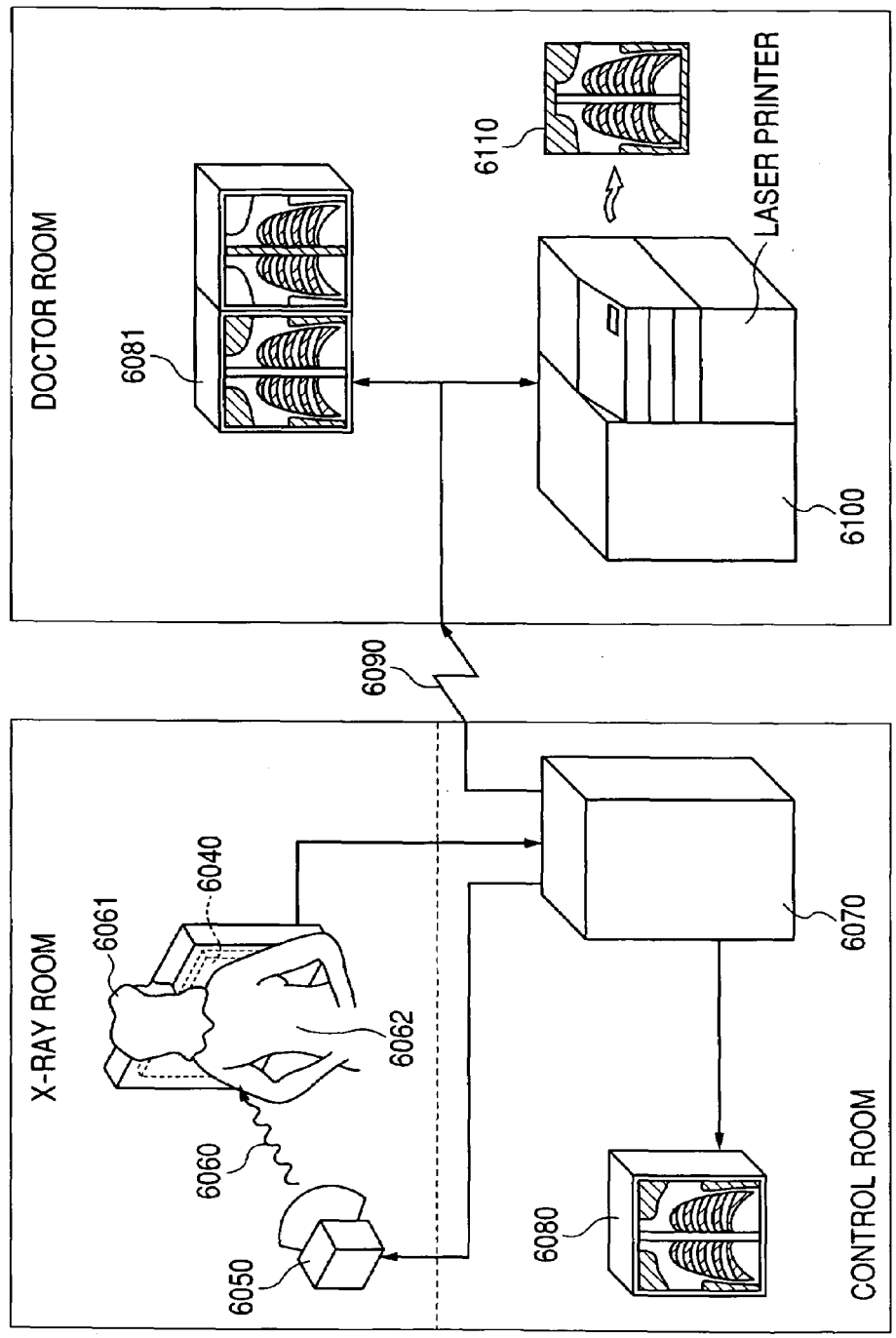
FIG. 15 is a view showing a radiation image pickup system of Embodiment 5 of the present invention.
Figure 16:
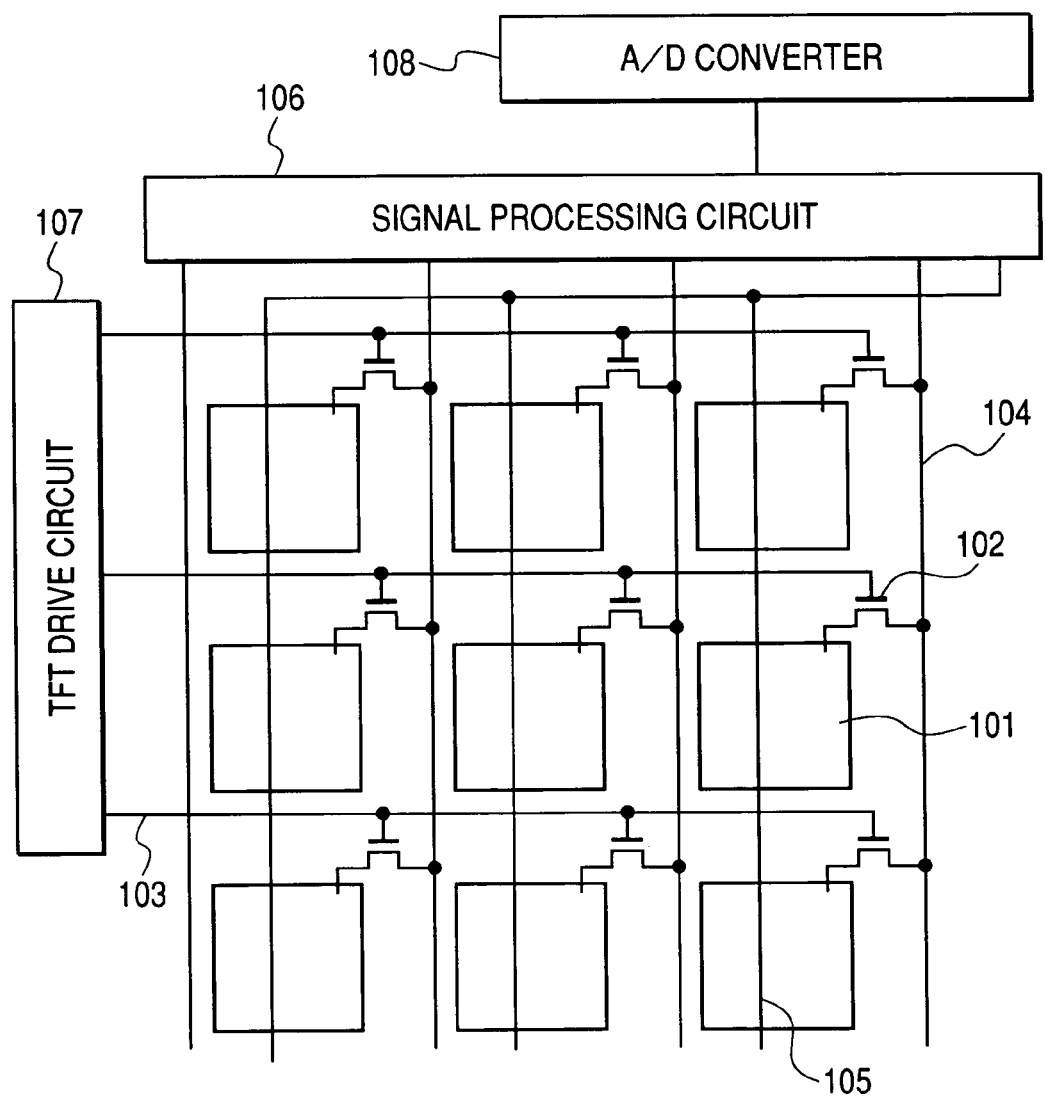
FIG. 16 is a schematic equivalent circuit diagram of a conventional FPD.
Figure 17:
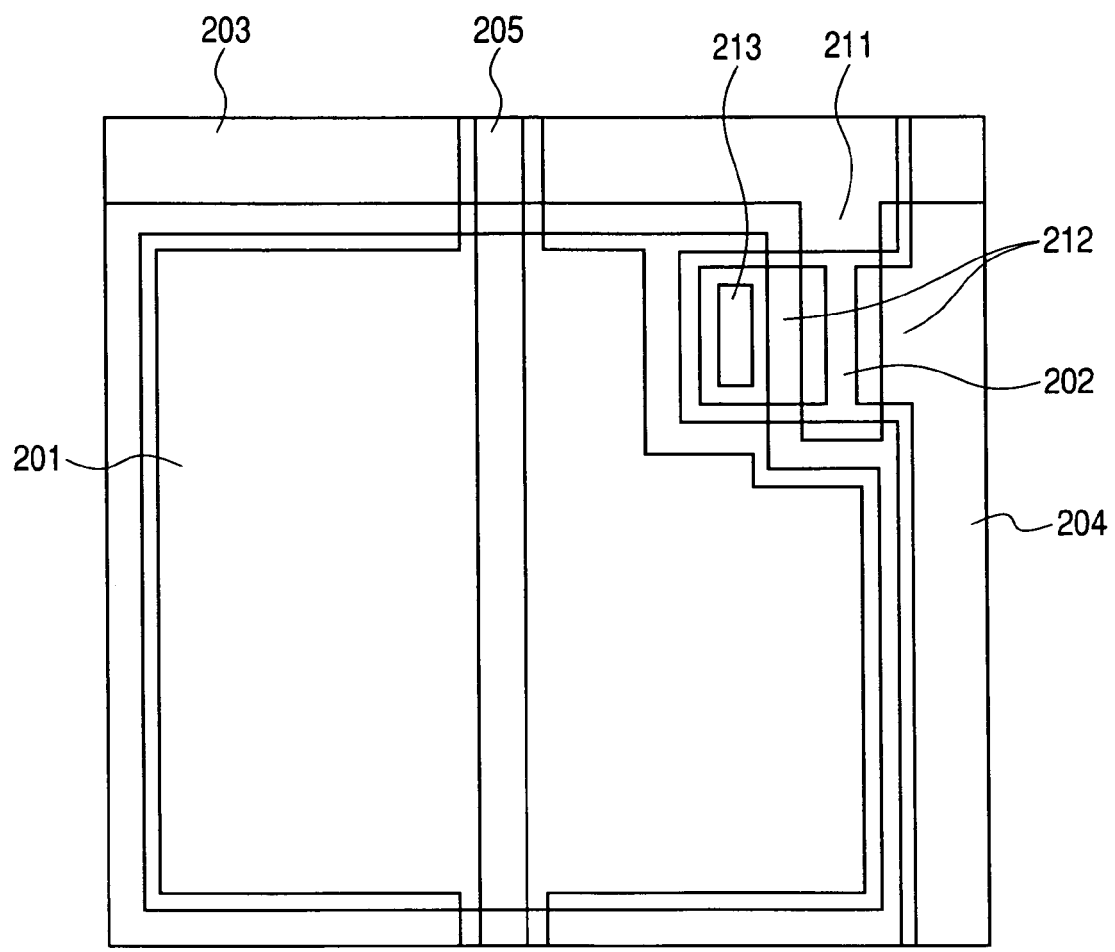
FIG. 17 is a schematic plan view of a pixel of a conventional MIS type photo-sensor (photoelectric conversion element)
Figure 18:
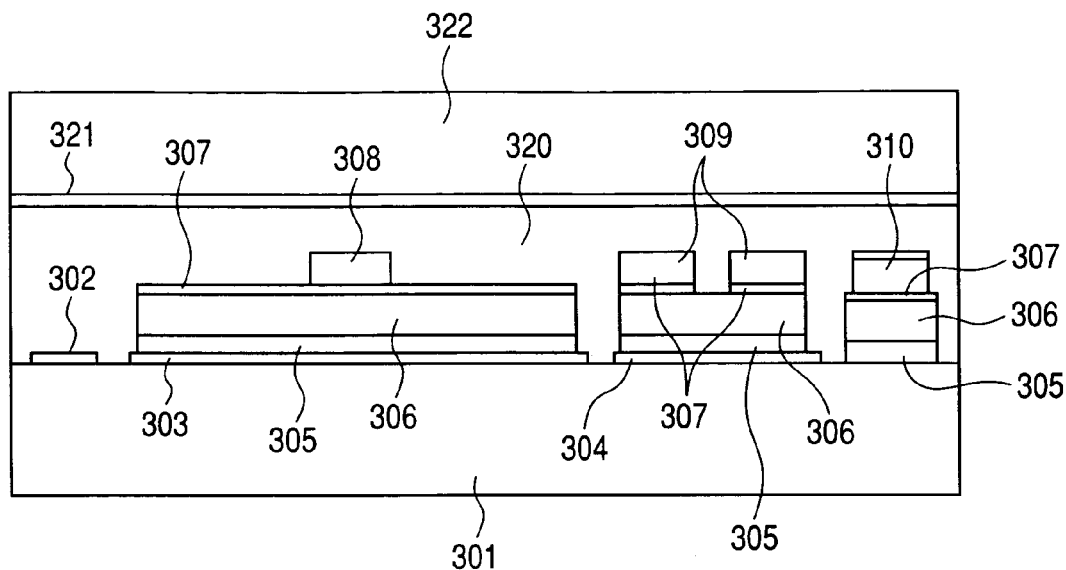
FIG. 18 is a sectional view in which each element of the pixel shown in FIG. 17 is schematically arranged.
Figure 19:
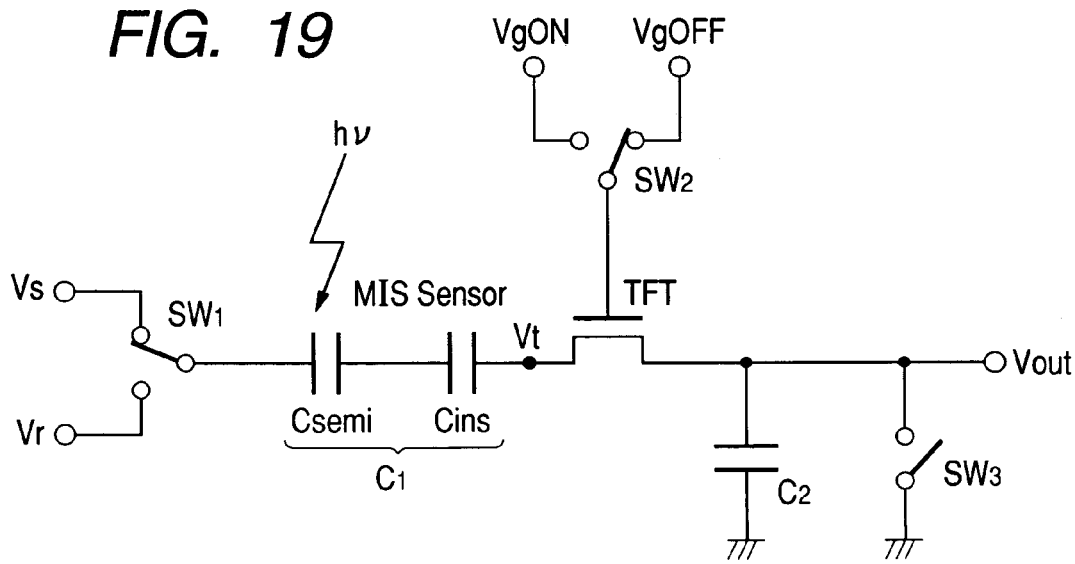
FIG. 19 is an equivalent circuit diagram of a bit of a conventional FPD.
Figure 20:
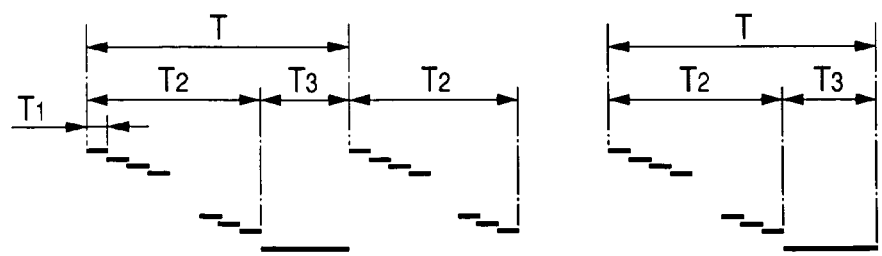
FIG. 20 is a schematic view illustrating a drive method of the conventional FPD.

FIG. 15 is a view showing the radiation image pickup system of the present embodiment. The radiation image pickup system is an example to which the radiation image pickup apparatus of Embodiments 1-4 are applied as a radiation image pickup system.

An X-ray 6060 generated by an X-ray tube 6050 penetrates the chest 6062 of a patient or a subject 6061, and enters a radiation image pickup apparatus 6040 radiographing a radiation image. The information inside the body of the patient 6061 is included in the entered X-ray. Corresponding to the incidence of the X-ray, the scintillator (phosphor layer) of the radiation image pickup apparatus 6040 emits light, and photoelectrically converts the emitted light into electric information to obtain it. The information is converted into a digital signal to receive the image processing by an image processor 6070, and is observable on a display 6080 as display means located in a control room.

Moreover, the information can be transferred to a remote place by transfer means such as a telephone line 6090, and the information can be displayed on a display 6081 in a doctor room of somewhere else or the like, or can be saved in preservation means such as an optical disk. Consequently, it is also possible that a doctor at a remote place can perform a diagnosis. Moreover, it is also possible to record the information on a film 6110 with a film processor 6100.

This application claims priority from Japanese Patent Application No. 2004-286994 filed Sep. 30, 2004, which is hereby incorporated by reference herein.

What is claimed is:

1. An image pickup apparatus, comprising:
a plurality of pixels arranged on an insulating substrate, each of said pixels including a conversion element, a first switching element connected to said conversion element in order to transfer an electric signal obtained by said conversion element, and a second switching element connected to said conversion element in order to reset said conversion element by giving constant potential to said conversion element, wherein
said second switching element includes a gate electrode, and a source electrode and a drain electrode, and one of the source electrode and the drain electrode is electrically connected with the gate electrode.

2. An image pickup apparatus according to claim 1, wherein said conversion element includes at least a first electrode, a second electrode, and a semiconductor layer arranged between the first electrode and the second electrode.

3. An image pickup apparatus according to claim 2, wherein said first switching element includes a gate electrode, and a source electrode and a drain electrode.

4. An image pickup apparatus according to claim 3, wherein one of the source electrode and the drain electrode of said first switching element and other one of the source electrode and the drain electrode of said second switching element are connected to a first electrode of said conversion element.

5. The image pickup apparatus according to claim 4, wherein said first switching element and said second switching element are arranged on said insulating substrate, and said conversion element is arranged on both of said first switching element and said second switching element with said insulating layer put between both of said switching elements.

6. An image pickup apparatus according to claim 4, wherein said plurality of pixels are arranged in an array including a plurality of lines, and the gate electrode of said first switching element in a predetermined line and the gate electrode of said second switching element in a preceding line are connected to same drive wiring.

7. An image pickup apparatus according to claim 6, wherein a drive voltage applied to said drive wiring has a plurality of ON voltage values.

8. An image pickup apparatus according to claim 1, wherein said conversion element is a photoelectric conversion element using non-single crystalline silicon in said semiconductor layer, and said first switching element and said second switching element are severally a thin film transistor composed of non-single crystalline silicon.

9. An image pickup apparatus according to claim 1, wherein said conversion element uses a semiconductor material capable of converting a radiation into a charge directly as said semiconductor layer.

10. The image pickup apparatus according to claim 1, further comprising:
a drive circuit for resetting through the second switching element the conversion elements along one line while reading out through the first switch element the conversion element along the other line.

11. An radiation image pickup apparatus, comprising:
a plurality of pixels arranged on an insulating substrate, each of said pixels includes a conversion element converting an entered radiation into an electric signal according to the radiation, a first switching element connected to said conversion element for transferring the electric signal, and a second switching element connected to said conversion element in order to reset said conversion element by supplying constant potential to said conversion element, wherein said second switching element includes a gate electrode, and a source electrode and a drain electrode, and one of the source electrode and the drain electrode is electrically connected with the gate electrode.

12. A radiation image pickup apparatus according to claim 11, wherein said conversion element includes at least a first electrode, a second electrode and a semiconductor layer arranged between the first electrode and the second electrode;

said first switching element includes a gate electrode, and a source electrode and a drain electrode; and one of the source electrode and the drain electrode of said first switching element and another of the source electrode and the drain electrode of said second switching element are electrically connected to a first electrode of said conversion element.

13. A radiation image pickup apparatus according to claim 12, wherein said conversion element includes a photoelectric conversion element using non-single crystalline silicon as said semiconductor layer, and a wavelength converter converting an entered radiation into light having a wavelength in a waveband sensible by said photoelectric conversion element, and said first switching element and said second switching element are severally a thin-film transistor made of non-single crystalline silicon.

14. A radiation image pickup system comprising:
a radiation image pickup apparatus according to claim 11;
processing means for processing a signal from said radiation image pickup apparatus;
storage means for storing a signal from said processing means;
transfer means for transferring a signal from said processing means;
display means for displaying a signal from said processing means as an image; and
a radiation source generating a radiation.

* * * * *

UNITED STATES PATENT AND TRADEMARK OFFICE
CERTIFICATE OF CORRECTION

| | | |
|---|---|---|
| PATENT NO. | : 7,282,719 B2 | |
| APPLICATION NO. | : 11/227149 | |
| DATED | : October 16, 2007 | |
| INVENTOR(S) | : Chiori Mochizuki et al. | |

It is certified that error appears in the above-identified patent and that said Letters Patent is hereby corrected as shown below:

ON THE TITLE PAGE [75]:

Inventors, "Keiichi Momura, Honjo (JP);" should read --Keiichi Nomura, Honjo (JP);--.

COLUMN 1:

Line 47, "anxious" should read --highly desired--; and
Line 64, "Up." should read --up.--.

COLUMN 4:

Line 47, "read" should read --been read--.

COLUMN 6:

Line 59, "element (TR2)" should read --element $(TR_2)$--.

COLUMN 8:

Line 45, "enter" should read --enters--; and
Line 64, "element (TR2)" should read --element $(TR_2)$--.

COLUMN 9:

Line 39, "resetting-switching" should read --resetting switching--; and
Line 51, "of course that it is" should read --, of course,--.

UNITED STATES PATENT AND TRADEMARK OFFICE
CERTIFICATE OF CORRECTION

PATENT NO.        : 7,282,719 B2
APPLICATION NO.   : 11/227149
DATED             : October 16, 2007
INVENTOR(S)       : Chiori Mochizuki et al.

It is certified that error appears in the above-identified patent and that said Letters Patent is hereby corrected as shown below:

COLUMN 12:

Line 64, "An" should read --A--.

Signed and Sealed this

Twenty-third Day of September, 2008

JON W. DUDAS
*Director of the United States Patent and Trademark Office*